United States Patent [19]
Yew et al.

[11] Patent Number: 5,956,233
[45] Date of Patent: Sep. 21, 1999

[54] HIGH DENSITY SINGLE INLINE MEMORY MODULE

[75] Inventors: Chee Kiang Yew; Kian Teng Eng; Sian Yong Khoo; Bok Leng Ser, all of Singapore, Singapore

[73] Assignee: Texas Instruments Incorporated, Dallas, Tex.

[21] Appl. No.: 08/994,625

[22] Filed: Dec. 19, 1997

[51] Int. Cl.$^6$ ........................................ H05K 7/02
[52] U.S. Cl. .................. 361/760; 361/748; 361/790; 361/750; 257/685; 257/686; 257/777; 257/723; 257/724; 174/250; 174/260; 174/262
[58] Field of Search ..................... 361/760, 748, 361/792, 750, 761, 790; 257/686, 685, 777, 723, 724, 778, 532; 174/262, 260, 250

[56] References Cited

U.S. PATENT DOCUMENTS

| | | | |
|---|---|---|---|
| 3,179,913 | 4/1965 | Mittler et al. | 339/18 |
| 3,370,203 | 2/1968 | Kravitz et al. | 317/101 |
| 3,459,998 | 8/1969 | Focarile | 317/100 |
| 3,904,934 | 9/1975 | Martin | 317/101 |
| 4,288,841 | 9/1981 | Gogal | 361/414 |
| 4,502,098 | 2/1985 | Brown et al. | 361/383 |
| 4,574,331 | 3/1986 | Smolley | 361/393 |
| 4,646,128 | 2/1987 | Carson et al. | 357/74 |
| 4,727,410 | 2/1988 | Higgins, III | 357/74 |
| 4,823,233 | 4/1989 | Brown et al. | 361/383 |
| 4,833,568 | 5/1989 | Berhold | 361/383 |
| 4,862,249 | 8/1989 | Carlson | 357/80 |
| 4,868,712 | 9/1989 | Woodman | 361/388 |
| 4,953,005 | 8/1990 | Carlson et al. | 357/80 |
| 4,992,850 | 2/1991 | Corbett et al. | 257/203 |
| 5,016,138 | 5/1991 | Woodman | 361/381 |
| 5,019,945 | 5/1991 | Smolley | 361/412 |
| 5,247,423 | 9/1993 | Lin et al. | 361/719 |
| 5,396,102 | 3/1995 | Toshio et al. | 257/723 |
| 5,412,538 | 5/1995 | Kikinis et al. | 361/792 |
| 5,594,275 | 1/1997 | Kwon et al. | 257/686 |
| 5,667,077 | 9/1997 | Goins, III | 209/573 |
| 5,687,109 | 11/1997 | Protigal et al. | 365/63 |
| 5,723,907 | 3/1998 | Akram | 257/723 |
| 5,731,633 | 3/1998 | Clayton | 257/723 |

*Primary Examiner*—Leo P. Picard
*Assistant Examiner*—David Foster
*Attorney, Agent, or Firm*—Mark A. Valetti; Carlton H. Hoel; Richard L. Donaldson

[57] ABSTRACT

A high density single inline memory module (140) comprising a printed circuit board (132) and at least one integrated circuit module (130) attached to the first side (134) of the printed circuit board (132), wherein the integrated circuit modules (130) each including first and second integrated circuit packages (30) stackably and electrically connected together is disclosed.

20 Claims, 3 Drawing Sheets

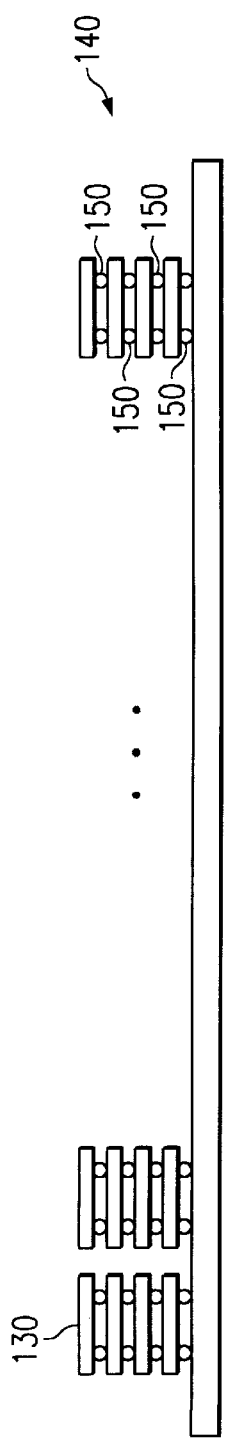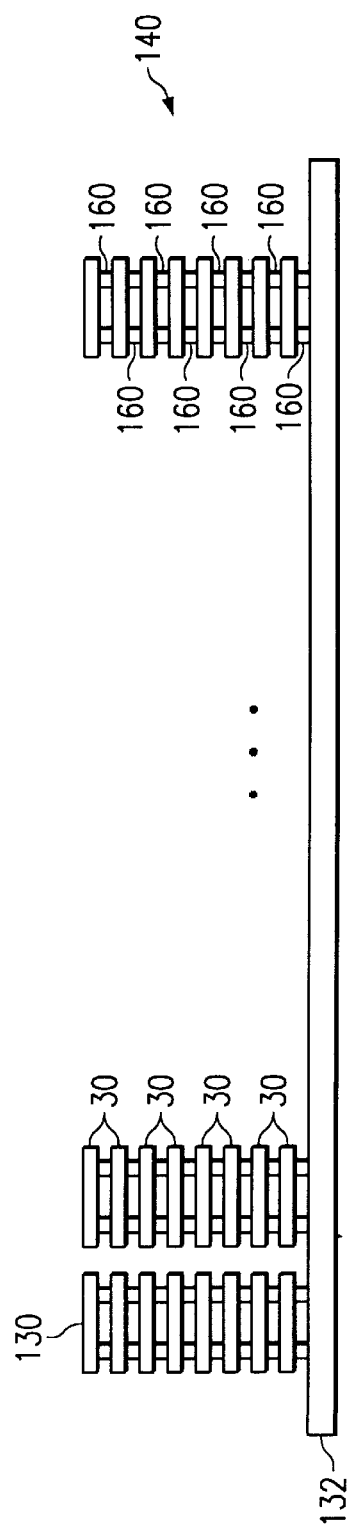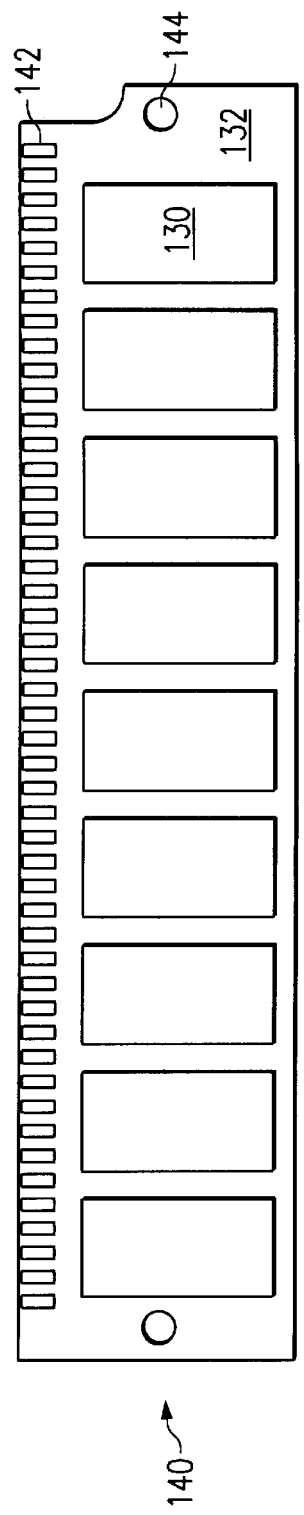

HIGH DENSITY SINGLE INLINE MEMORY MODULE

TECHNICAL FIELD OF THE INVENTION

The present invention relates in general to the field of single inline memory modules (SIMMs) and more specifically to substantially flat, integrated circuit packages electrically connected to one another and to one side of a printed circuit board to form a SIMM and a method for producing the same.

BACKGROUND OF THE INVENTION

Without limiting the scope of the invention, its background is described in connection with single inline memory modules, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Commonly, integrated circuit packages are attached to other components such as single inline memory modules which are typically referred to as SIMMs. SIMMs may, for example, be used to increase the memory of typically personal computers. As memory demands increase, so has the need for increased Input/Output (I/O) capacity and memory capacity of SIMMs. Efforts to enhance these capacities, however, have been limited by the amount of space available in the environment in which the SIMMs operate.

Therefore, a need has arisen for high density SIMMs and a process for producing high density SIMMs that provide for the stacking of integrated circuit packages on the SIMMs. A need has also arisen for materials and methods that lead to increases in I/O and/or memory capacity. Further, a need has arisen for a flat, double-sided integrated circuit package that provides protection to the wire bonding and silicon chip during subsequent manufacturing and testing steps and from the environment of its intended purpose.

SUMMARY OF THE INVENTION

The present invention disclosed herein comprises a high density SIMM and a process for producing a high density SIMM that provides for the stacking of double sided integrated circuit packages that protect the components of the integrated circuit package during manufacturing and testing steps and from the environment of its intended purpose. The integrated circuit packages are stackably mounted together and attached to one side of a printed circuit board to form a high density SIMM.

The present invention comprises at least a first integrated circuit package and a second integrated circuit package that are stackably and electrically connected together to form an integrated circuit module. At least one integrated circuit module is electrically connected to a single side of a printed circuit board having tabs to form the SIMM.

Even though the invention is described in terms of first and second integrated circuit packages for simplicity and convenience, it is to be understood that any number of integrated circuit packages may be stacked to form the integrated circuit module using the materials and techniques described herein.

The first and second integrated circuit packages each include a substrate having an opening and first and second surfaces. A plurality of routing strips are integral with the substrate and extend into the opening. A plurality of pads are disposed on the first and second surfaces. At least one of the pads disposed on the first surface and at least one of the pads disposed on the second surface are electrically connected with at least one of the routing strips. The first and second integrated circuit packages also including at least one via electrically connecting the pads disposed on the first surface with the pads disposed on said second surface.

A chip is adhered to each of the substrates. Each chip has bonding pads disposed thereon. Wire bonding electrically connects the bonding pads to the routing strips. A potting material in the opening provides protection to the wire bonding.

The integrated circuit packages further include bus bars being integral with the substrates and extending into the openings. The bus bar electrically connects at least one of the bonding pads of the chip to at least one the pads disposed on the first and the second surfaces of the substrate.

The integrated circuit module is formed by electrically connecting at least one of the pads disposed on the second surface of the first integrated circuit package with at least one of the pads disposed on the first surface of the second integrated circuit package. In one embodiment, solder balls are used to make the electrical connection between the first and second integrated circuit packages. In another embodiment, columns are used to make the electrical connection between the first and second integrated circuit packages The integrated circuit module may further include additional integrated circuit packages stackably and electrically connected together, for example, a third integrated circuit package may be stackably and electrically connected to the second integrated circuit package and a fourth integrated circuit package may be stackably and electrically connected to the third integrated circuit package.

Once the integrated circuit modules are constructed, they may be attached to a single side of a printed circuit board to form a SIMM. In this way, the number of integrated circuit packages stacked at a given location on the SIMM may be increased, thus enabling a higher density SIMM.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 6 is a simplified end view of a SIMM having integrated circuit modules attached to one side thereof;

FIG. 7 is a simplified end view of a SIMM having integrated circuit modules attached to one side thereof; and FIG. 8 is a top view of a SIMM showing the high density stacked configuration of integrated circuit modules mounted thereon.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to high frequency integrated circuits using a board-on-chip design to enable a plurality of integrated circuit packages to be stacked together and electrically connected as modules to a single side of a printed circuit board to form a SIMM for high speed performance that meets the space constraint requirements of modern semiconductors. The principles of the present invention may be incorporated into, for example, a synchronous DRAM (SDRAM) silicon chip. However, the present invention is also applicable to LOGIC, SRAM, EPROM and any other memory device.

Figure 1:
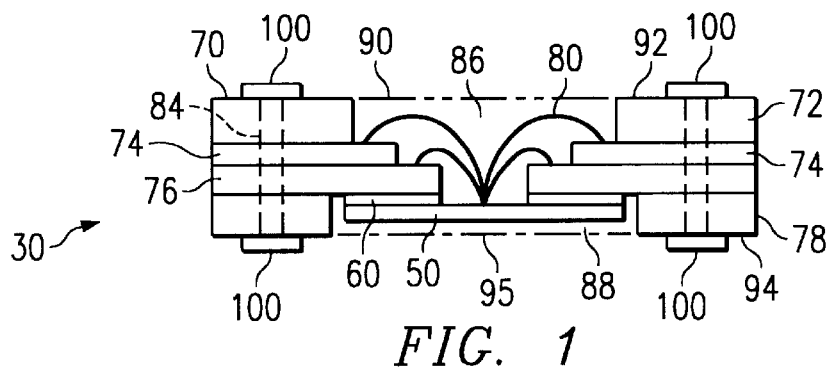
FIG. 1 is a simplified end cross-sectional view of an integrated circuit package of the present invention.

FIG. 1 is a simplified cross-sectional view of an integrated circuit package that is generally designated 30. The integrated circuit package 30 comprises a silicon chip 50, which can be, for example, any integrated circuit component such as a DRAM, an EPROM, a SRAM or a LOGIC chip. A printed circuit board 70 is attached to the silicon chip 50 by an adhesive layer 60. The adhesive layer 60 may be made of, for example, a double-sided adhesive polyamide tape, adhesive glue or epoxy. The printed circuit board 70 consists of four layers, a top layer 72, an intermediate layer 74, an intermediate layer 76, and a bottom layer 78.

The printed circuit board 70 may be constructed from a material such as FR-4 which is available from, for example, Motorola Inc., U.S.A. FR-4 is an epoxy resin reinforced with a woven glass cloth. In selecting the material for printed circuit board 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/°C. A difference in the coefficient of thermal expansion between the printed circuit board 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u. Alternatively, the silicon chip 50 can be adhered to the printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the printed circuit board 70 at 160° C. for 5 seconds with an applied force of 1000–3000 grams; then attaching the silicon chip 50 on the film at 220° C. for 5 seconds under a force of 150–200 grams.

DF-335 has the following properties

| Test | Remarks | Units | DF-335 |
|---|---|---|---|
| Appearance | Visual | — | silver film |
| Solid Content | 200° C.-2 h | wt % | ≧96 |
| Ash Content | 600° C.-1.5 h | wt % | 40 |
| Ash Content/ Solid | 600° C.-1.5 h | wt %/solid | 42 |
| Thickness | Dial gauge | μm | 25 |
| Tensile Strength | R.T. | kgf/mm² | 7.1 |
| Tensile Modulus | R.T. | kgf/mm² | 271 |
| Die shear strength R.T. | 4 × 4 mm chip/Ag plated alloy 42 | kgf/chip | ≧10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C.-1 h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Figure 2:
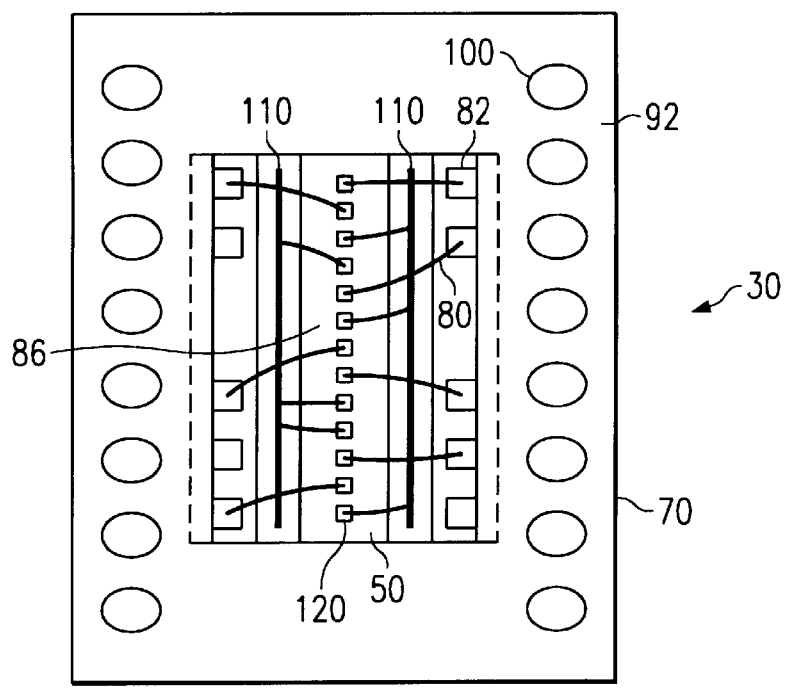
FIG. 2 is a simplified top view of an integrated circuit package of the present invention.

Referring collectively to FIGS. 1 and 2, intermediate layer 74 has routing strips 82 that are electrically connected through vias 84 to pads 100 located on top surface 92 of top of top layer 72 and bottom surface 94 of bottom layer 78. It should be understood by one skilled in the art that the terms "top" and "bottom" as well as the terms "side" and "end" are used for illustration purposes only, as the integrated circuit package 30 of the present invention can be assembled and used in a variety of positions and ways. Intermediate layer 76 includes a pair of bus bars 110. The bus bars are electrically connected through vias 84 to one or more of the pads 100. The bus bars 110 may serve, for example, as power supplies or grounds, and it is preferred that one bus bar 110 serve one function, such as a power supply, and the second bus bar 110 serve another function, such as a ground.

The silicon chip 50 has bonding pads 120 located generally in the central area of silicon chip 50. The bonding pads 120 are connected to routing strips 82 and bus bars 110 by wire bonding 80.

Even though FIG. 1 depicts printed circuit board 70 as having four layers 72, 74, 76 and 78, it should be understood by one skilled in the art that printed circuit board 70 may consist of a single layer or may be a multi-layered board having an alternate number of layers.

The above described components and their constructions and interrelation provide an assembly that is encapsulated as described below. The term "assembly" refers to the assembled components prior to encapsulation. The assembly consists of printed circuit board 70, adhered silicon chip 50 and wire bonding 80. The printed circuit board 70 has a top opening 86 and a cavity 88 with routing strips 82 and bus bars 110 extending into the top opening 86. The top opening 86 and the cavity 88 are open with respect to one another.

The wire bonding 80 process may begin after silicon chip 50 has been adhered to printed circuit board 70. Silicon chip 50 and printed circuit board 70 are then positioned on a heated pedestal to raise the temperature of the combination to a point between 100°–300° C. A gold wire having a diameter typically ranging from 0.7 mil. to 1.3 mil. is strung through a heated capillary where the temperature may range between 200°–500° C. A soldering ball is created at the end of the wire using either a flame or a spark technique. This soldering ball is then brought to bonding pad 120 on the silicon chip 50 and a combination of compression force and ultrasonic energy are used to create the desired metallurgical bond. Using this "stitch" technique significantly reduces the cross-section of the wire at that point. A loop is created in the wire bonding 80 above the bond that has just been achieved, and the wire bonding 80 is routed to the desired connection on the printed circuit board 70 such as routing strip 82 or bus bar 110. The wire bonding 80 is clamped and the capillary raised, such that the wire bonding 80 will break free at the outer edge of the bond. This process is repeated until all the bonding pads 120 that require electrical connection on the silicon chip SO are electrically connected to printed circuit board 70.

Following the assembly of the above-described components, cavity 88 and top opening 86 are filled with potting material 90 as represented by the dashed line above top opening 86 and below cavity 88.

The potting material 90 may be a cyanate ester-type resin available from Shin-Etsu Chemical Co., Ltd. As KMC 184VA and KMC 188VA-4. Other examples of potting materials that may be used with the present invention include epoxies, polyesters, polyimides, cyanoacrylates, ceramic, silicone and urethane. The potting materials may also contain fillers that affect the coefficient of thermal expansion, as well as the strength and flexibility of the potting material. The selection of potting materials and fillers will depend on the components used to make the integrated circuit package 30, as will be known to those of skill in the art.

Potting materials that may be used include those described in the table herein below. Selection of a potting material 90 will depend on the materials used in the integrated circuit package 30, as will be known by those of skill in the art.

|  | Epoxy | Polyester | Silicone | Urethane |
|---|---|---|---|---|
| Dielectric constant, D-150 | | | | |
| 60 Hz | 3.9 | 4.7 | 2.7 | 5.7 |
| $10^6$ Hz | 3.2 | — | 2.7 | 3.4 |
| Dissipation factor, D-150 | | | | |
| 60 Hz | 0.04 | 0.017 | 0.001 | 0.123 |
| $10^6$ Hz | 0.03 | — | 0.001 | 0.03 |
| Dielectric strength, D-149; V/mil | 450 | 325 | 550 | 400 |
| Volume resistivity, D-257; $\Omega \cdot$ cm | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in$^2$, ° F. | 380 | 260 | <70 | <70 |
| Tensile strength D-638; lb/in$^2$ | 9000 | 10,000 | 1000 | 2000 |
| Impact strength (Izod), D-256; ft · lb/in | 0.5 | 0.3 | No break | No break |
| Coefficient of thermal expansion, D-969; $10^{-5}$/° F. | 5.5 | 7.5 | 4.0 | 15 |
| Thermal donductivity, C-177; Btu · in/(h · ft$^2$ · ° F.) | 1.7 | 1.7 | 1.5 | 1.5 |
| Linear shrinkage, % | 0.3 | 3.0 | 0.4 | 2.0 |
| Elongation, D-638; % | 3 | 3 | 175 | 300 |

Although the board-on-chip layout of integrated circuit package 30 as depicted in FIGS. 1 and 2 has been described using centralized bonding pads 120, it should be understood by one skilled in the art that the principles of the present invention are applicable to a silicon chip 50 with bonding pads 120 in alternate layouts such as positioned along the sides of the silicon chip 50.

Also, it should be noted by one skilled in the art that pads 100 and bus bars 110 may be located on a single layer of printed circuit board 70. Generally, a layer of insulated tape or coating may be placed on the bus bars 110 to provide for electrical isolation. The advantage of a multi-layer printed circuit board 70, however, is the elimination of the need to insulate the bus bars 110. The present invention disposes with the need for isolation. Additionally, the multi-layer printed circuit board 70 provides a greater process margin for wire bonding.

Figure 3:
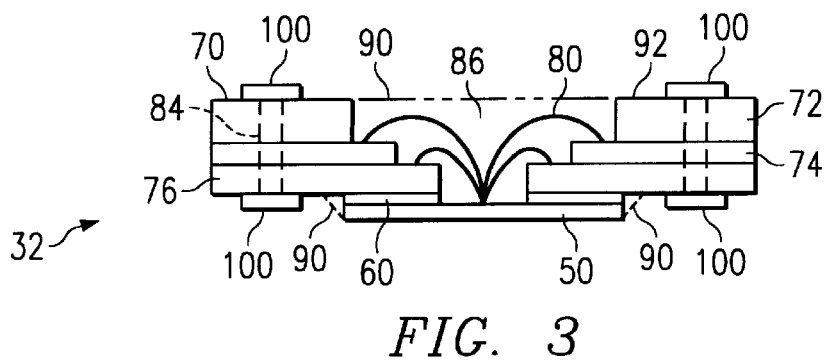
FIG. 3 is a simplified end cross-sectional view of an integrated circuit package of the present invention.

FIG. 3 is a simplified cross-sectional view of an integrated circuit package that is generally designated 32. The integrated circuit package 32 comprises a silicon chip 50 and a printed circuit board 70 which is attached to the silicon chip 50 by an adhesive layer 60. In this embodiment, the printed circuit board 70 consists of three layers, a top layer 72, an intermediate layer 74 and a bottom layer 76. The printed circuit board 70 has a top opening 86. As best seen in FIG.

2, routing strips 82 and bus bars 110 extend into the top opening 86. After assembly, top opening 86 is filled with potting material 90 as represented by the dashed line above top opening 86 and around silicon chip 50. Vias 84 electrically connect pads 100 located on top surface 92 of top layer 72 and bottom surface 94 of bottom layer 78.

Figure 4:
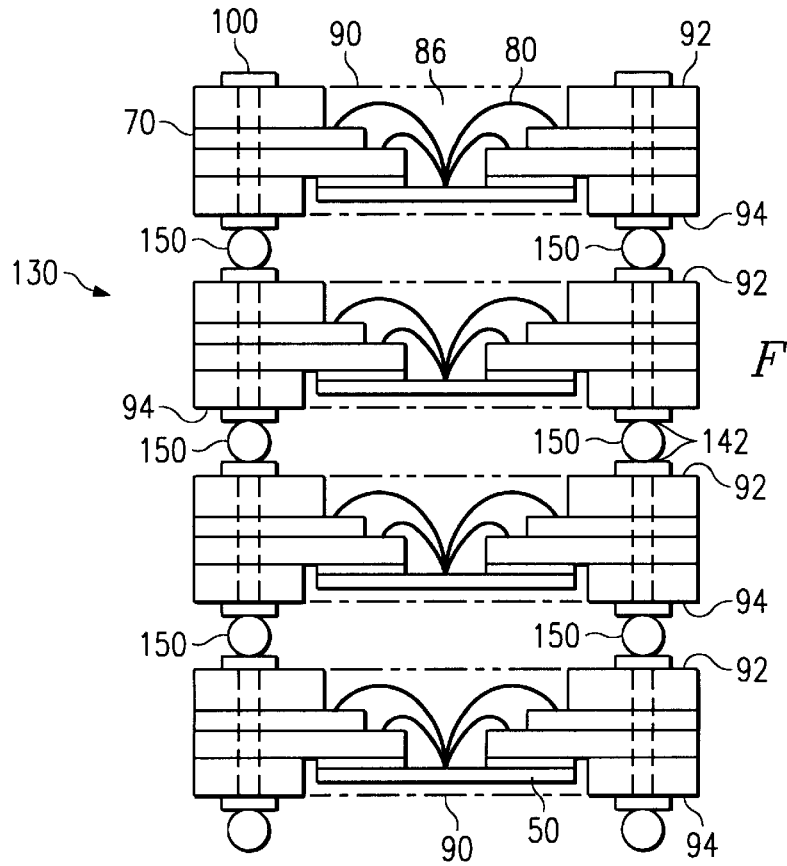
FIG. 4 is a simplified end cross-sectional view of an integrated circuit module having a plurality of integrated circuit packages oriented in a stacked configuration electronically connected together with solder balls.

In FIG. 4, one embodiment of a three dimensional integrated circuit module is depicted in a simplified cross-sectional view and is generally designated 130. A silicon chip 50 is electronically connected to the printed circuit board 70 by means of wire bonding 80 followed by encapsulating the wire bonding 80 with a potting material 90. Integrated circuit package 30 is then interconnected with other integrated circuit packages 30 using solder balls 150. Solder balls 150 replace the leads used to connect conventional integrated circuit packages to, for example, a motherboard. The use of solder balls 150 reduces the overall profile of the integrated circuit package 30 and the integrated circuit module 130.

The solder balls 150 used with the present invention may be attached to the pads 100 using conventional solder reflow systems. For example, a vapor phase solder reflow system may be used, which condenses vapor to surround the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the non-chlorinated fluorocarbons that are used as vapor fluids is shown below.

| Fluid Temperature | Solder Type |
| --- | --- |
| 56, 80, 97, 101, 102° C. and 155° C. | 100 In |
|  | 37 Sn/38 Pb/25 In |
| 165° C. | 70 Sn/18 Pn/12 In |
|  | 70 In/30 Pb |
| 174° C. | 60 In/40 Pb |
| 190° C. | 90 In/10 Ag |
|  | 50 In/50 Pb |
|  | 63 Sn/37 Pb |
|  | 70 Sn/30 Pb |
|  | 60 Sn/40 Pb |
| 215° C. and 230° C. | 60 Sn/40 In |
|  | 60 Sn/40 Pb |
|  | 63 Sn/37 Pb |
|  | 70 Sn/30 Pb |
|  | 62 Sn/36 Pb/2 Ag |

-continued

| Fluid Temperature | Solder Type |
| --- | --- |
| 240° C. and 253° C. | 7S Pb/25 In |
|  | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The present invention also solves other problems associated with solder reflow systems. These problems include the creation or failure due to voids, coplanarity, tombstoning, open joints, component cracking, thermal shock and thermal stressing. The present invention solves these problems because it dispenses with the need for electrically connecting soldering leads to the integrated circuit package 30. By using solder balls 150 instead of leads, the problems associated with voids around pad areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal.

Open joints are usually caused by problems with coplanarity, while cracking may occur when trapped moisture within an integrated circuit package expands as the device is heated for reflow. The increase in internal pressure, causes the integrated circuit package to split open, usually at one of the corners. The splitting of the package causes wire bonding from the lead frame to the silicon chip to break and in some cases the silicon chips have cracked due to the warpage at the top of the package as the temperature differentials between the top and the bottom of the device cause different rates of expansion.

Using the present invention, the only surface temperature differential that occurs is between the solder ball 150 and the printed circuit board 70, which allows either vapor phase solder reflow or radiant heat solder reflow to be available for producing the present invention. The small size of the solder balls 150, and of the integrated circuit package 130 as a whole, allows for any of the reflow systems to be used with the because the temperature differential between the components is almost negligible. Furthermore, by selecting a potting material 90 having a coefficient of thermal expansion similar, or equal to, the coefficient of thermal expansion of the other components of the integrated circuit package 30, heat reflow effects and problems can be minimized.

Figure 5:
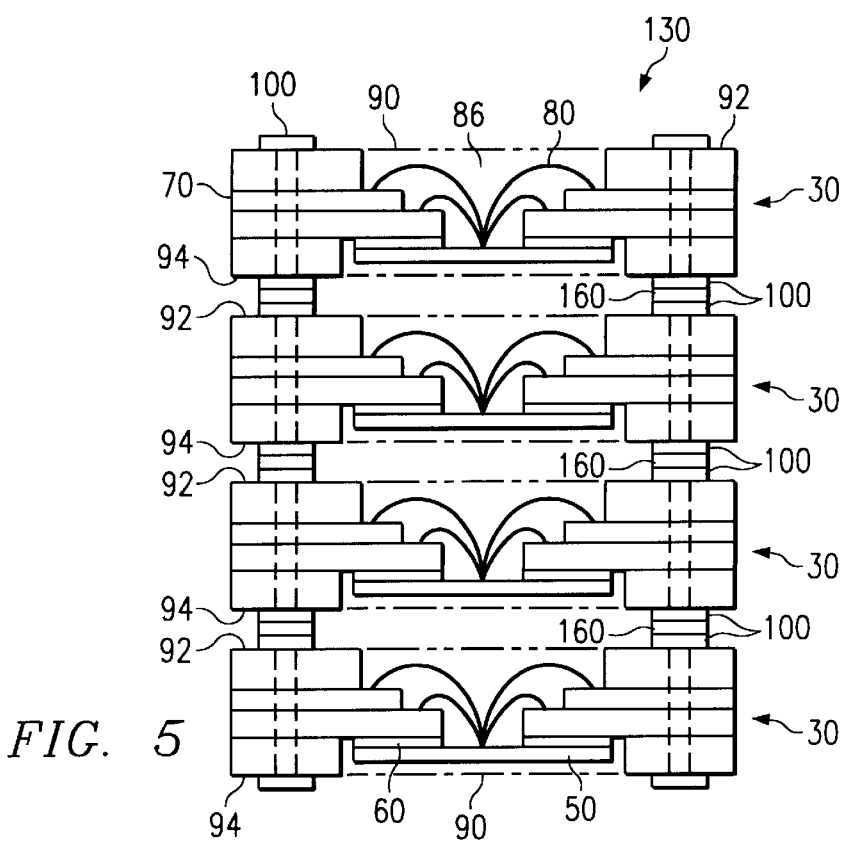
FIG. 5 is a simplified end cross-sectional view of an integrated circuit module having a plurality of integrated circuit packages oriented in a stacked configuration electronically connected together with columns.

In FIG. 5, another embodiment of a three dimensional integrated circuit module is depicted in a simplified cross-sectional view and is generally designated 130. A silicon chip 50 is attached to the printed circuit board 70 by adhesive layer 60 and is electrically connected to the printed circuit board 70 by means of wire bonding 80 followed by encapsulation of the wire bonding 80 with a potting material 90. Integrated circuit package 30 is then interconnected with other integrated circuit packages 30 using columns 160, instead of solder balls 150. Columns 160 also replace the leads used to connect conventional integrated circuit packages to, for example, a motherboard. The use of columns 160 reduces the overall profile of the integrated circuit package 30 and the integrated circuit module 130.

In FIG. 6 is shown one embodiment of a high density SIMM 140 drawn according to the present invention. The integrated circuit packages 30 are stacked four high forming integrated circuit modules 130. Each individual integrated circuit package 30 is electrically connected to the next by solder balls 150 as also depicted in FIG. 4. For convenience of illustration, the dots between the integrated circuit modules 130 represent additional integrated circuits modules 130 which may be attached to printed circuit board 132.

In FIG. 7, another embodiment of a SIMM 140 is depicted. The integrated circuit modules 130 are formed by stacking eight integrated circuit packages 30 together. Each integrated circuit package 30 is electrically connected to the next by columns 160 as also depicted in FIG. 5. The integrated circuit modules 130 are electrically connected to a single side of printed circuit board 132 to form the SIMM 140.

In FIG. 8 is shown a top view of a SIMM 140 comprising a printed circuit board 132 having a plurality of integrated circuit modules 130 attached thereon. Each integrated circuit module 130 has a plurality of integrated circuit packages 30 stacked together using solder balls 150, columns 160 or other electrically connective means. SIMM 140 has tabs 142 which may be electrically connected to expansion slots in a personal computer. Locator holes 144 may be used to align SIMM 140 within the expansion slots.

The present invention, therefore, allows for the stacking of integrated circuit packages 30 into an integrated circuit module 130 which is mounted on a printed circuit board 132 to increase the density of the SIMM 140 and achieve an overall reduction in height. It also allows for decreased failure due to the reduced number of soldered materials having varying coefficients of thermal expansion. The present invention further reduces the overall number of steps in the assembly of SIMMs by streamlining the assembly process not only in reduced number of steps, but also by elimination the curing steps associated with encapsulating integrated circuit. The present invention further reduces the amount of material used in producing integrated circuit packages 30, thereby saving time, money and the environment.

Furthermore, the method of the present invention takes advantage of the opening 86 at the center of the printed circuit board 70 for potting the wire bonding 80 that connect the silicon chip 50 and the printed circuit board 70 in a single step. By filling the opening 86 with potting material 90, the wire bonding 80 between silicon chip 50 and the printed circuit board 70 is generally protected from the environment and is particularly protected from moisture due to the hermetic nature of the encapsulation.

This means of potting the integrated circuit package 30 of the present invention greatly reduces the overall profile by allowing the non-operative or backside of the silicon chip 50 to be exposed. By hermetically protecting the connections between the silicon chip 50 and the printed circuit board 70 at the top opening 86, there is no need to completely encapsulate the entire assembly.

The problems of coplanarity are eliminated by using solder balls 150 or columns 160 to attach the integrated circuit module 130 to the printed circuit board 132 because there are no leads that may bend and there are no deviations from the plane of the printed circuit board 132 to which the integrated circuit module 130 is being connected.

Additionally, reduced environmental impact is obtained using the method and apparatus of the present invention due to the overall decrease in the size of the integrated circuit package 30.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A high density single inline memory module comprising:
    a printed circuit board having first and second sides; and
    at least one integrated circuit module comprising at least first and second memory integrated circuits coupled together in a columnar arrangement and spaced vertically apart and electrically connected to said first side of said printed circuit board.

2. The high density single inline memory module as recited in claim 1 further comprising a plurality of electrically conductive tabs being integral with said printed circuit board, said electrically conductive tabs being electrically coupled to said printed circuit board.

3. The high density single inline memory module as recited in claim 1 wherein said at least one integrated circuit module electrically connected to said first side of said printed circuit board each further comprise first and second integrated circuit packages stackably and electrically connected together and spaced apart to allow airflow between them.

4. The high density single inline memory module as recited in claim 3 wherein said first and second integrated circuit packages further include:
    a substrate having an opening and first and second surfaces;
    a plurality of routing strips being integral with said substrate and extending into said opening;
    a plurality of pads disposed on said first and second surfaces, at least one of said pads disposed on said first surface being electrically connected with at least one of said routing strips and at least one of said pads disposed on said second surface being electrically connected with at least one of said routing strips;
    at least one via electrically connecting at least one of said pads disposed on said first surface with at least one of said pads disposed on said second surface;
    a chip adhered to one of said surfaces of said substrate, said chip having at least one bonding pad on a first surface, said at least one bonding pad being placed somewhere within said opening, said chip having a second surface;
    wire bonding electrically connecting said at least one bonding pad to at least one of said routing strips; and
    potting material filling said opening and covering said wire bonding and the surface of said chip containing said at least one bonding pad;
    wherein the second surface of said chip is in physical contact with the ambient environment.

5. The high density single inline memory module as recited in claim 4 wherein said first and second integrated circuit packages further include at least one bus bar being integral with said substrate and extending into said opening, said bus bar electrically connected to at least one of said bonding pads and at least one said pads disposed on said first and said second surfaces of said substrate.

6. The high density single inline memory module as recited in claim 5 wherein at least one of said pads disposed on said second surface of said first integrated circuit packages is electrically connected with at least one of said pads disposed on said first surface of said second integrated circuit packages.

7. The high density single inline memory module as recited in claim 3 further comprising solder balls disposed between said first and said second integrated circuit packages.

8. The high density single inline memory module as recited in claim 3 further comprising columns disposed between said first and said second integrated circuit packages.

9. The high density single inline memory module as recited in claim 1 further comprising solder balls disposed between said integrated circuit modules and said printed circuit board.

10. The high density single inline memory module as recited in claim 1 further comprising columns disposed between said integrated circuit modules and said printed circuit board.

11. A high density single inline memory module comprising:
- a printed circuit board having first and second sides; and
- first and second integrated circuit modules respectively attached to said first side of said printed circuit board, said first and second integrated circuit modules each including first and second integrated circuit packages stackably and electrically connected together and spaced apart, said integrated circuit packages each including:
  - a substrate having an opening and first and second surfaces;
  - a plurality of routing strips being integral with said substrate and extending into said opening;
  - a plurality of pads disposed on said first and second surfaces, at least one of said pads disposed on said first surface being electrically connected with at least one of said routing strips and at least one of said pads disposed on said second surface being electrically connected with at least one of said routing strips;
  - at least one via electrically connecting at least one of said pads disposed on said first surface with at least one of said pads disposed on said second surface;
  - a chip adhered to one of said surfaces of said substrate, said chip having at least one bonding pad on a first surface, said at least one bonding pad being placed somewhere within said opening, said chip having a second surface;
  - wire bonding electrically connecting said at least one bonding pad to at least one of said routing strips; and
  - potting material filling said opening and covering said wire bonding and the surface of said chip containing said at least one bonding pad;

wherein the second surface of said chip is in physical contact with the ambient environment.

12. The high density single inline memory module as recited in claim 11 further comprising a plurality of electrically conductive tabs being integral with said printed circuit board and being electically coupled to said printed circuit board.

13. The high density single inline memory module as recited in claim 11 further comprising solder balls disposed between said integrated circuit modules and said printed circuit board.

14. The high density single inline memory module as recited in claim 11 further comprising columns disposed between said integrated circuit modules and said printed circuit board.

15. A high density single inline memory module produced by a process comprising the steps of:
- obtaining a printed circuit board having first and second sides; and
- electrically connecting at least one integrated circuit module to said first side of said printed circuit board.

16. The process as recited in claim 15 wherein the step of electrically connecting at least one integrated circuit module to said first side of said printed circuit board further includes the step of stackably and electrically connecting first and second integrated circuit packages together.

17. The process as recited in claim 16 wherein the step of stackably and electrically connected first and second integrated circuit packages together further includes the steps of:
- obtaining a substrate having an opening and first and second surfaces;
- extending a plurality of routing strips within said substrate into said opening;
- disposing a plurality of pads on said first and second surfaces;
- electrically connecting at least one of said pads with at least one of said routing strips;
- electrically connecting at least one of said pads disposed on said first surface with at least one of said pads disposed on said second surface with at least one via;
- adhering a chip to said substrate, said chip having at least one bonding pad;
- electrically connecting said at least one bonding pad to at least one of said routing strips with wire bonding; and
- filling said opening with a potting material.

18. The process as recited in claim 15 further including the step of disposing solder ball between said integrated circuit module and said first side of said printed circuit board.

19. The process as recited in claim 15 further including the step of disposing columns between said integrated circuit module and said first side of said printed circuit board.

20. The process as recited in claim 15 further including the step of integrally attaching a plurality of tabs to said printed circuit board.

* * * * *